(12) United States Patent
Hansen et al.

(10) Patent No.: US 7,466,773 B2
(45) Date of Patent: Dec. 16, 2008

(54) WLAN RECEIVER HAVING AN ITERATIVE DECODER

(75) Inventors: Christopher J. Hansen, Sunnyvale, CA (US); Jason A. Trachewsky, Menlo Park, CA (US); Ashish Bhargave, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 580 days.

(21) Appl. No.: 10/876,230

(22) Filed: Jun. 24, 2004

(65) Prior Publication Data

US 2005/0185739 A1    Aug. 25, 2005

Related U.S. Application Data

(60) Provisional application No. 60/546,051, filed on Feb. 19, 2004.

(51) Int. Cl.
*H03D 1/00* (2006.01)
*H04L 27/06* (2006.01)

(52) U.S. Cl. ........................ 375/341; 375/262

(58) Field of Classification Search ......... 375/259–262, 375/265, 340–341, 316, 377; 700/1, 28, 700/53; 370/203, 210
See application file for complete search history.

(56) References Cited

U.S. PATENT DOCUMENTS 6,810,502 B2 * 10/2004 Eidson et al. .............. 714/786
2003/0076890 A1 * 4/2003 Hochwald et al. ........... 375/264
2003/0103584 A1 * 6/2003 Bjerke et al. ................ 375/340
2003/0193966 A1 * 10/2003 Mills ........................ 370/476

* cited by examiner

*Primary Examiner*—James M Perez
(74) *Attorney, Agent, or Firm*—Garlick Harrison & Markison; Timothy W. Markison

(57) ABSTRACT

An iterative decoder for use in a WLAN includes an inner decoder/detector, a first subtraction module, a deinterleaving module, an outer decoder, a second subtraction module, an interleaving module, and a determining module. The inner decoder/detector determines inner coded bits and extrinsic information of the inner coded bits from symbol vector based on a channel matrix and inner extrinsic information feedback. The first subtraction module subtracts the inner extrinsic information feedback from the extrinsic information of the inner coded bits. The deinterleaving module deinterleaves the output of the first subtraction module to produce deinterleaved inner extrinsic information. The outer decoder determines outer coded bits and extrinsic information of the outer coded bits from the deinterleaved inner extrinsic information. The second subtraction module subtracts the deinterleaved inner extrinsic information from the extrinsic information of the outer coded bits. The interleaving module interleaves the output of the second subtraction module to produce the inner extrinsic information feedback. The determining module produces decoded bits based on the outer coded bits.

23 Claims, 9 Drawing Sheets

RF receiver 76 - 80

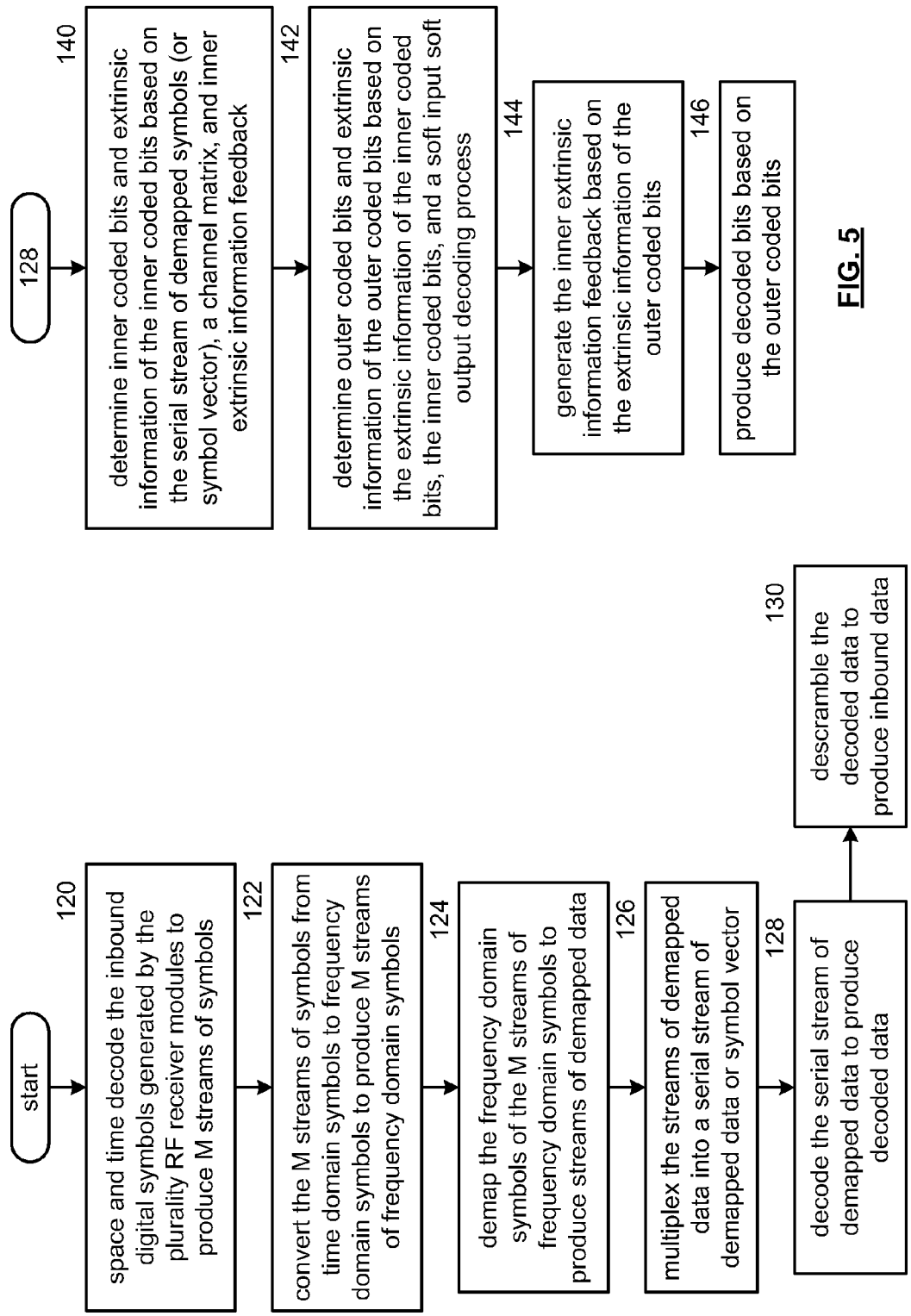

WLAN receiver 76 - 80

BB processing module 64 iterative decoder 312 iterative decoder 312 outer decoder module 328
(turbo decoder)

WLAN RECEIVER HAVING AN ITERATIVE DECODER

This invention is claiming priority under 35 USC §119(e) to a provisionally filed patent application having the same title as the present patent application, a filing date of Feb. 19, 2004, and a Ser. No. of 60/546,051.

REFERENCE TO SEQUENTIAL LISTING

The present patent application hereby incorporates the appendix attached hereto.

BACKGROUND OF THE INVENTION

1. Technical Field of the Invention

This invention relates generally to wireless communication systems and more particularly to a receiver processing data at high data rates within such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Typically, the transmitter will include one antenna for transmitting the RF signals, which are received by a single antenna, or multiple antennas, of a receiver. When the receiver includes two or more antennas, the receiver will select one of them to receive the incoming RF signals. In this instance, the wireless communication between the transmitter and receiver is a single-output-single-input (SOSI) communication, even if the receiver includes multiple antennas that are used as diversity antennas (i.e., selecting one of them to receive the incoming RF signals). For SISO wireless communications, a transceiver includes one transmitter and one receiver. Currently, most wireless local area networks (WLAN) that are IEEE 802.11, 802.11a, 802,11b, or 802.11g employ SISO wireless communications.

Other types of wireless communications include single-input-multiple-output (SIMO), multiple-input-single-output (MISO), and multiple-input-multiple-output (MIMO). In a SIMO wireless communication, a single transmitter processes data into radio frequency signals that are transmitted to a receiver. The receiver includes two or more antennas and two or more receiver paths. Each of the antennas receives the RF signals and provides them to a corresponding receiver path (e.g., LNA, down conversion module, filters, and ADCs). Each of the receiver paths processes the received RF signals to produce digital signals, which are combined and then processed to recapture the transmitted data.

For a multiple-input-single-output (MISO) wireless communication, the transmitter includes two or more transmission paths (e.g., digital to analog converter, filters, up-conversion module, and a power amplifier) that each converts a corresponding portion of baseband signals into RF signals, which are transmitted via corresponding antennas to a receiver. The receiver includes a single receiver path that receives the multiple RF signals from the transmitter. In this instance, the receiver uses beam forming to combine the multiple RF signals into one signal for processing.

For a multiple-input-multiple-output (MIMO) wireless communication, the transmitter and receiver each include multiple paths. In such a communication, the transmitter parallel processes data using a spatial and time encoding function to produce two or more streams of data. The transmitter includes multiple transmission paths to convert each stream of data into multiple RF signals. The receiver receives the multiple RF signals via multiple receiver paths that recapture the streams of data utilizing a spatial and time decoding function. The recaptured streams of data are combined and subsequently processed to recover the original data.

With the various types of wireless communications (e.g., SISO, MISO, SIMO, and MIMO), it would be desirable to use one or more types of wireless communications to enhance data throughput within a WLAN. For example, theoretically high data rates can be achieved with MIMO communications in comparison to SISO communications. However, practical implementations of wireless communication devices that support MIMO communications are very limited. For receivers, one area which limits a practical implementation is the decoder.

Therefore, a need exists for a WLAN receiver that is capable of processing high data rates of MIMO communications and includes a practical implementation of a decoder.

BRIEF SUMMARY OF THE INVENTION

The wireless local area network (WLAN) receiver having an iterative decoder of the present invention substantially meets these needs and others. In one embodiment, a method for high data throughput reception in a WLAN begins by receiving a symbol vector representing M streams of symbols transmitted via a wireless communication channel. The method continues by determining inner coded bits and extrinsic information of the inner coded bits based on the symbol vector, a channel matrix, and inner extrinsic information feedback. The method continues by determining outer coded bits and extrinsic information of the outer coded bits based on the extrinsic information of the inner coded bits, the inner coded bits, and a soft input soft output decoding process. The method continues by generating the inner extrinsic information feedback based on the extrinsic information of the outer coded bits. The method continues by producing decoded bits based on the outer coded bits.

In another embodiment, a wireless local area network (WLAN) receiver having high data throughput includes a plurality of radio frequency (RF) receiving modules and a baseband processing module. Each of the plurality of the RF receiving modules is operably coupled to receive inbound RF signals and to convert them into inbound digital symbols. The baseband processing module converts the inbound digital symbols into inbound data by space and time decoding the inbound digital symbols generated by the plurality RF receiver modules to produce M streams of symbols. The baseband processing module then converts the M streams of symbols from time domain symbols to frequency domain symbols to produce M streams of frequency domain symbols. The baseband processing module then demaps the frequency domain symbols of the M streams of frequency domain symbols to produce streams of demapped data. The baseband processing module then multiplexes the streams of demapped data into a serial stream of demapped data. The baseband processing module then decodes the serial stream of demapped data to produce decoded data. The baseband processing module then descrambles the decoded data to produce inbound data.

In yet another embodiment, an iterative decoder for use in a wireless local area network (WLAN) receiver having high data throughput includes an inner decoder/detector, a first subtraction module, a deinterleaving module, an outer decoder, a second subtraction module, an interleaving module, and a determining module. The inner decoder/detector is operably coupled to determine inner coded bits and extrinsic information of the inner coded bits from symbol vector based on a channel matrix and inner extrinsic information feedback. The first subtraction module is operably coupled to subtract the inner extrinsic information feedback from the extrinsic information of the inner coded bits to produce current inner extrinsic information. The deinterleaving module is operably coupled to deinterleave the current inner extrinsic information to produce deinterleaved inner extrinsic information. The outer decoder is operably coupled to determine outer coded bits and extrinsic information of the outer coded bits from the deinterleaved inner extrinsic information in accordance with a soft input soft output decoding process. The second subtraction module is operably coupled to subtract the deinterleaved inner extrinsic information from the extrinsic information of the outer coded bits to produce current outer extrinsic information. The interleaving module is operably coupled to interleave the current outer extrinsic information to produce the inner extrinsic information feedback. The determining module is operably coupled to produce decoded bits based on the outer coded bits.

BRIEF DESCRIPTION OF THE SEVERAL VIEWS OF THE DRAWINGS

FIG. 4 is a logic diagram of a method for receiving high data throughput signals in accordance with the present invention;

FIG. 5 is a logic diagram of a method for decoding serial data in accordance with the present invention;

DETAILED DESCRIPTION OF THE INVENTION

Figure 1:
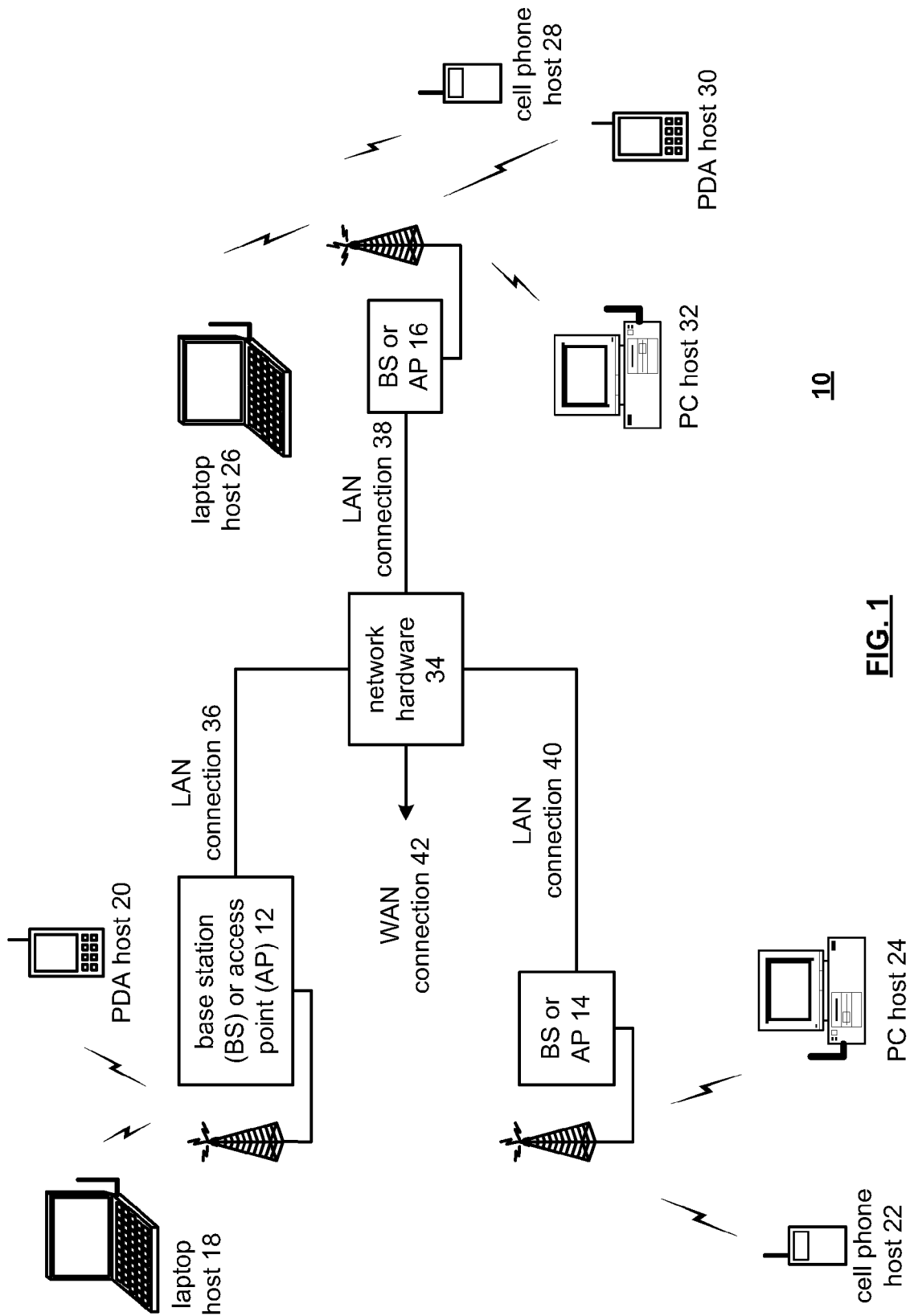
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
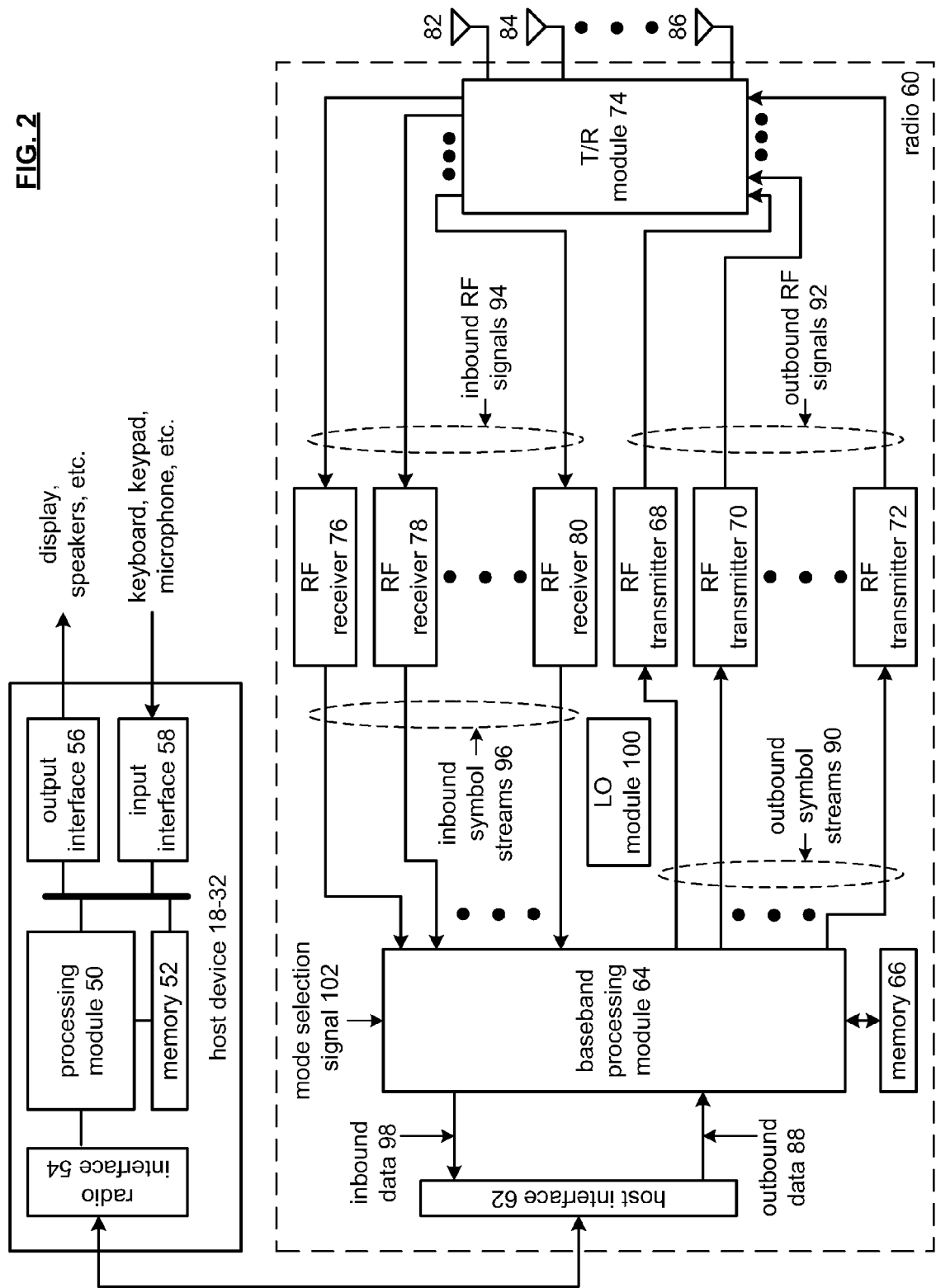
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 64, memory 66, a plurality of radio frequency (RF) transmitters 68-72, a transmit/receive (T/R) module 74, a plurality of antennas 82-86, a plurality of RF receivers 76-80, and a local oscillation module 100. The baseband processing module 64, in combination with operational instructions stored in memory 66, execute digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and/or digital baseband to IF conversion. The baseband processing modules 64 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 66 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 88 from the host device via the host interface 62. The baseband processing module 64 receives the outbound data 88 and, based on a mode selection signal 102, produces one or more outbound symbol streams 90. The mode selection signal 102 will indicate a particular mode as are illustrated in the mode selection tables, which appear at the end of the detailed discussion. For example, the mode selection signal 102, with reference to table 1 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. As is further illustrated in table 1, a code rate is supplied as well as number of coded bits per subcarrier (NBPSC), coded bits per OFDM symbol (NCBPS), data bits per OFDM symbol (NDBPS), error vector magnitude in decibels (EVM), sensitivity which indicates the maximum receive power required to obtain a target packet error rate (e.g., 10% for IEEE 802.11a), adjacent channel rejection (ACR), and an alternate adjacent channel rejection (AACR).

The mode selection signal may also indicate a particular channelization for the corresponding mode which for the information in table 1 is illustrated in table 2. As shown, table 2 includes a channel number and corresponding center frequency. The mode select signal may further indicate a power spectral density mask value which for table 1 is illustrated in table 3. The mode select signal may alternatively indicate rates within table 4 that has a 5 GHz frequency band, 20 MHz channel bandwidth and a maximum bit rate of 54 megabits-per-second. If this is the particular mode select, the channelization is illustrated in table 5. As a further alternative, the mode select signal 102 may indicate a 2.4 GHz frequency band, 20 MHz channels and a maximum bit rate of 192 megabits-per-second as illustrated in table 6. In table 6, a number of antennas may be utilized to achieve the higher bandwidths. In this instance, the mode select would further indicate the number of antennas to be utilized. Table 7 illustrates the channelization for the set-up of table 6. Table 8 illustrates yet another mode option where the frequency band is 2.4 GHz, the channel bandwidth is 20 MHz and the maximum bit rate is 192 megabits-per-second. [Table 8 is 45 GHz frequency band.] The corresponding table 8 includes various bit rates ranging from 12 megabits-per-second to 216 megabits-per-second utilizing 2-4 antennas and a spatial time encoding rate as indicated. Table 9 illustrates the channelization for table 8. The mode select signal 102 may further indicate a particular operating mode as illustrated in table 10, which corresponds to a 5 GHz frequency band having 40 MHz frequency band having 40 MHz channels and a maximum bit rate of 486 megabits-per-second. As shown in table 10, the bit rate may range from 13.5 megabits-per-second to 486 megabits-per-second utilizing 1-4 antennas and a corresponding spatial time code rate. Table 10 further illustrates a particular modulation scheme code rate and NBPSC values. Table 11 provides the power spectral density mask for table 10 and table 12 provides the channelization for table 10.

The baseband processing module 64, based on the mode selection signal 102 produces the one or more outbound symbol streams 90, as will be further described with reference to FIGS. 5-9 from the output data 88. For example, if the mode selection signal 102 indicates that a single transmit antenna is being utilized for the particular mode that has been selected, the baseband processing module 64 will produce a single outbound symbol stream 90. Alternatively, if the mode select signal indicates 2, 3 or 4 streams 90 corresponding to the number of antennas from the output data 88.

Depending on the number of outbound streams 90 produced by the baseband module 64, a corresponding number of the RF transmitters 68-72 will be enabled to convert the outbound symbol streams 90 into outbound RF signals 92. The implementation of the RF transmitters 68-72 will be further described with reference to FIG. 3. The transmit/receive module 74 receives the outbound RF signals 92 and provides each outbound RF signal to a corresponding antenna 82-86.

When the radio 60 is in the receive mode, the transmit/receive module 74 receives one or more inbound RF signals via the antennas 82-86. The T/R module 74 provides the inbound RF signals 94 to one or more RF receivers 76-80. The RF receiver 76-80, which will be described in greater detail with reference to FIG. 4, converts the inbound RF signals 94 into a corresponding number of inbound symbol streams 96. The number of inbound symbol streams 96 will correspond to the particular mode in which the data was received (recall that the mode may be any one of the modes illustrated in tables 1-12). The baseband processing module 60 receives the inbound symbol streams 90 and converts them into inbound data 98, which is provided to the host device 18-32 via the host interface 62.

As one of average skill in the art will appreciate, the wireless communication device of FIG. 2 may be implemented using one or more integrated circuits. For example, the host device may be implemented on one integrated circuit, the baseband processing module 64 and memory 66 may be implemented on a second integrated circuit, and the remaining components of the radio 60, less the antennas 82-86, may be implemented on a third integrated circuit. As an alternate example, the radio 60 may be implemented on a single integrated circuit. As yet another example, the processing module 50 of the host device and the baseband processing module 64 may be a common processing device implemented on a single integrated circuit. Further, the memory 52 and memory 66 may be implemented on a single integrated circuit and/or on the same integrated circuit as the common processing modules of processing module 50 and the baseband processing module 64.

Figure 3:
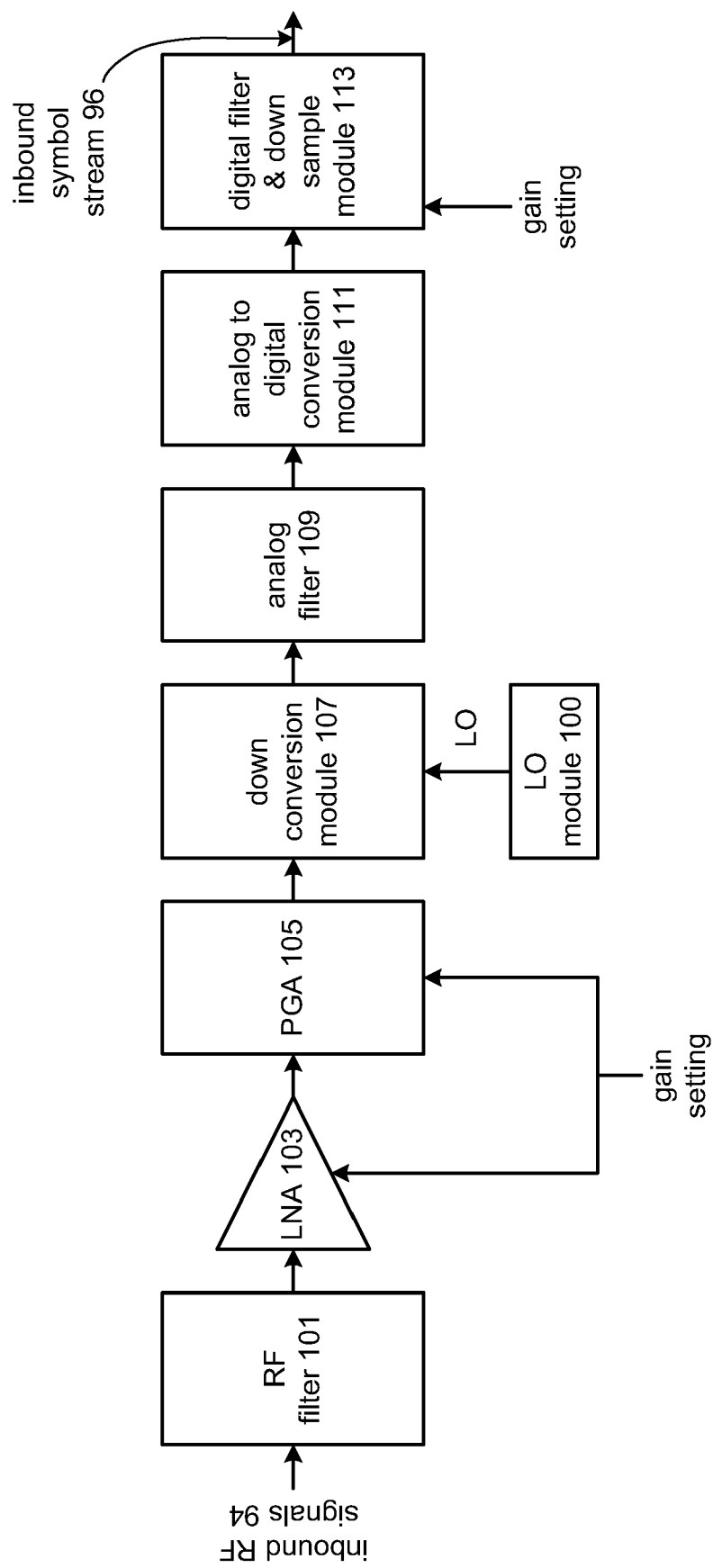
FIG. 3 is a schematic block diagram of an RF. receiver in accordance with the present invention.

FIG. 3 is a schematic block diagram of each of the RF receivers 76-80. In this embodiment, each of the RF receivers 76-80 includes an RF filter 101, a low noise amplifier (LNA) 103, a programmable gain amplifier (PGA) 105, a down-conversion module 107, an analog filter 109, an analog-to-digital conversion module 111 and a digital filter and down-sampling module 113. The RF filter 101, which may be a high frequency band-pass filter, receives the inbound RF signals 94 and filters them to produce filtered inbound RF signals. The low noise amplifier 103 amplifies the filtered inbound RF signals 94 based on a gain setting and provides the amplified signals to the programmable gain amplifier 105. The programmable gain amplifier further amplifies the inbound RF signals 94 before providing them to the down-conversion module 107.

The down-conversion module 107 includes a pair of mixers, a summation module, and a filter to mix the inbound RF signals with a local oscillation (LO) that is provided by the local oscillation module to produce analog baseband signals. The analog filter 109 filters the analog baseband signals and provides them to the analog-to-digital conversion module 111 which converts them into a digital signal. The digital filter and down-sampling module 113 filters the digital signals and then adjusts the sampling rate to produce the inbound symbol stream 96.

FIG. 4 is a method performed by the baseband processing module 64 to convert one or more streams of symbols into inbound data. The method begins at step 120 where the baseband processing module space and time decodes the inbound digital symbols generated by the plurality RF receiver modules to produce M streams of symbols. In one embodiment, the number of M output paths of the space and time decoding will equal the number of P-input paths of the space and time decoding. In another embodiment, the number of input paths P will equal M+1 paths. For each of the paths, the space/time decoder multiples the input symbols with a decoding matrix that has the form of $$\begin{bmatrix} C_1 & C_2 & C_3 & \ldots & C_{2M-1} \\ -C_2^* & C_1^* & C_4 & \ldots & C_{2M} \end{bmatrix}$$

Note that the rows of the decoding matrix correspond to the number of input paths and the columns correspond to the number of output paths.

The process then proceeds to step 122 where the baseband processing module converts the M streams of symbols from time domain symbols to frequency domain symbols to produce M streams of frequency domain symbols. This may be done using a fast Fourier transformer (FFT). In one embodiment, this step may further include removal of inter-symbol interference based on a prefix. Note that, in general, a 64-point FFT will be used for 20 MHz channels and 128-point FFT will be used for 40 MHz channels.

The process then proceeds to step 124 where the baseband processing module demaps the frequency domain symbols of the M streams of frequency domain symbols to produce streams of demapped data. The process then proceeds to step 126 where the baseband processing module multiplexes the streams of demapped data into a serial stream of demapped data, or symbol vector. The process then proceeds to step 128 where the baseband processing module decodes the serial stream of demapped data to produce decoded data. The process then proceeds to step 130 where the baseband processing module descrambles the decoded data to produce inbound data.

FIG. 5 is a logic diagram of a method for decoding the serial stream of demapped data as previously described in step 128 of FIG. 4. The decoding begins at step 140 where the baseband processing module determines inner coded bits and extrinsic information of the inner coded bits based on the serial stream of demapped symbols, a channel matrix, and inner extrinsic information feedback. In an embodiment, this may be done by using an A Posteriori Probability (APP) algorithm to generate a log-likelihood ratio value for each transmitted bit of the M streams of symbols. In a further embodiment, a tree search algorithm in accordance with the APP algorithm may be used to generate the log-likelihood ratio value based on differential feedback equalization.

The process then proceeds to step 142 where the baseband processing module determines outer coded bits and extrinsic information of the outer coded bits based on the extrinsic information of the inner coded bits, the inner coded bits, and a soft input soft output decoding process. In an embodiment, deinterleaved inner extrinsic information may be used to represent the extrinsic information of the inner coded bits, where the deinterleaved inner extrinsic information is produced by subtracting the inner extrinsic information feedback from the extrinsic information of the inner coded bits to produce current inner extrinsic information and deinterleaving the current inner extrinsic information to produce deinterleaved inner extrinsic information. In another embodiment, the determination of the outer coded bits and the extrinsic information of the outer coded bits may include deinterleaving the inner coded bits to produce deinterleaved inner coded bits and using the deinterleaved inner coded bits to represent the inner coded bits to determine the outer coded bits and the extrinsic information of the outer coded bits. In an embodiment, the soft input soft output decoding processing may be a convolutional code for determining the outer coded bits and the extrinsic information of the outer coded bits or it may be a turbo code for determining the outer coded bits and the extrinsic information of the outer coded bits.

The process then proceeds to step 144 where the baseband processing module generates the inner extrinsic information feedback based on the extrinsic information of the outer coded bits. In an embodiment, the inner extrinsic information feedback may be generated by subtracting the deinterleaved current inner extrinsic information from the extrinsic information of the outer coded bits to produce current outer extrinsic information and interleaving the current outer extrinsic information to produce the inner extrinsic information feedback. The process then proceeds to step 146 where the baseband processing module produces decoded bits based on the outer coded bits.

Figure 6:
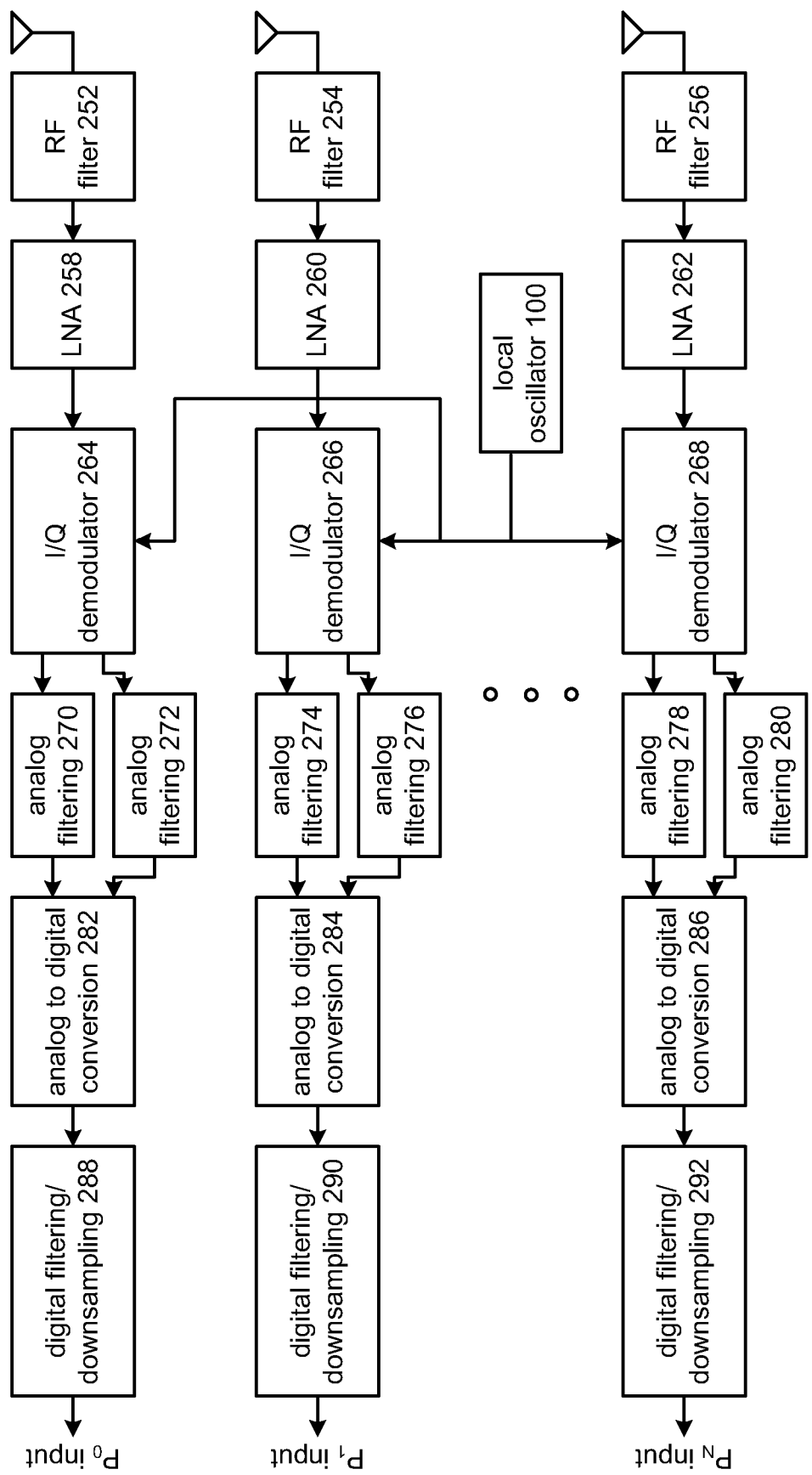
FIG. 6 is a schematic block diagram of analog radio portions of a receiver in accordance with the present invention.

FIG. 6 illustrates the analog portion of the receiver which includes a plurality of receiver paths. Each receiver path includes an antenna, RF filters 252-256, low noise amplifiers 258-260, I/Q demodulators 264-268, analog filters 270-280, analog-to-digital converters 282-286 and digital filters and down-sampling modules 288-290.

In operation, the antennas receive inbound RF signals, which are band-pass filtered via the RF filters 252-256. The corresponding low noise amplifiers 258-260 amplify the filtered signals and provide them to the corresponding I/Q demodulators 264-268. The I/Q demodulators 264-268, based on a local oscillation, which is produced by local oscillator 100, down-converts the RF signals into baseband in-phase and quadrature analog signals. Note that the RF signals received by the antennas may be generated by a MIMO transmitter as described in co-pending patent application entitled WLAN TRANSMITTER HAVING HIGH DATA THROUGHPUT, having the same provisional filing date as the present patent application, and an attorney docket number of BP 3516. This co-pending patent application is incorporated herein by reference.

The corresponding analog filters 270-280 filter the in-phase and quadrature analog components, respectively. The analog-to-digital converters 282-286 convert the in-phase and quadrature analog signals into a digital signal. The digital filtering and down-sampling modules 288-290 filter the digital signals and adjust the sampling rate to correspond to the rate of the baseband processing, which will be described in FIG. 7.

Figure 7:
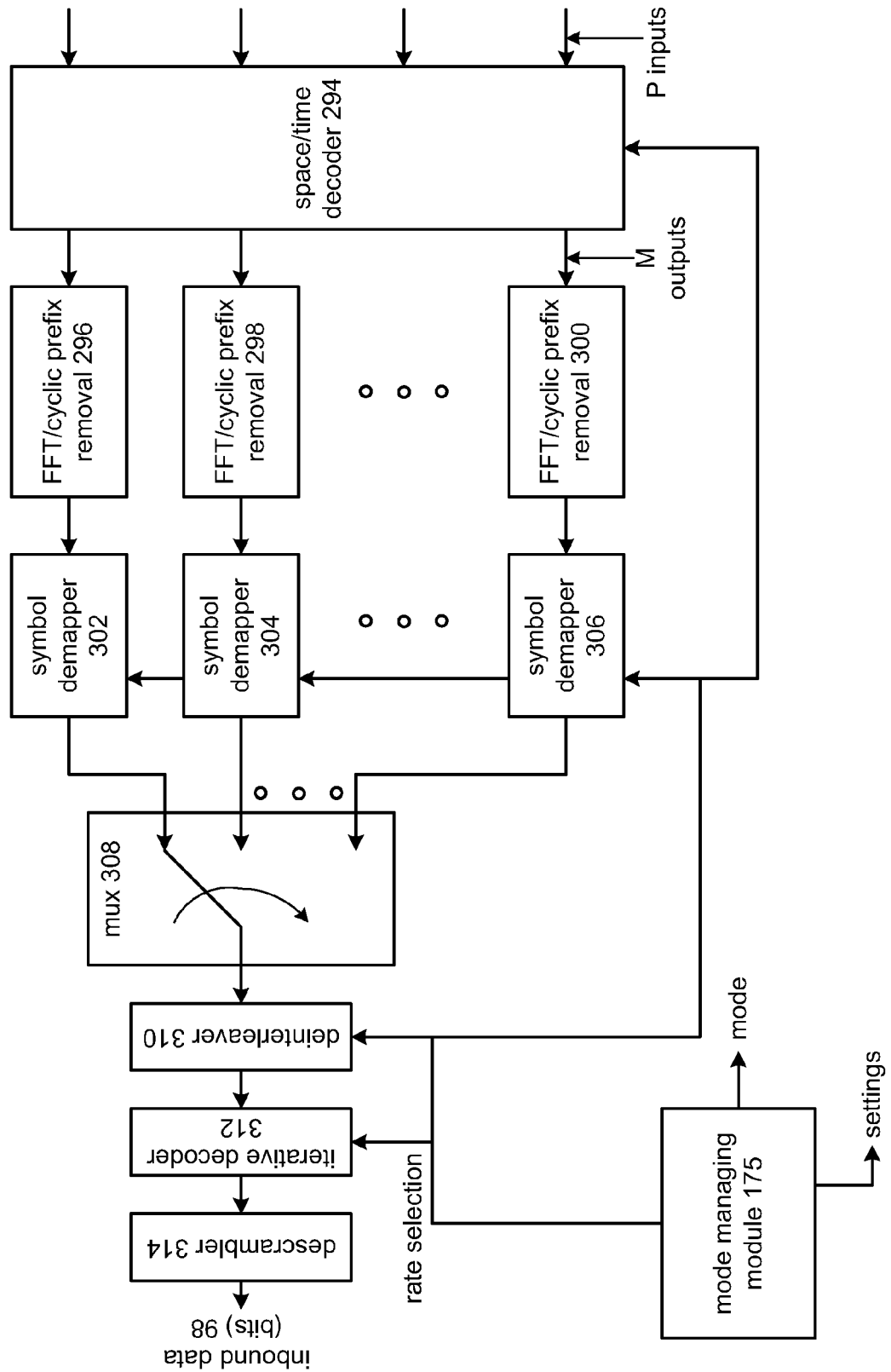
FIG. 7 is a schematic block diagram of digital baseband portions of a receiver in accordance with the present invention.

FIG. 7 illustrates the baseband processing of a receiver. The baseband processing includes a space/time decoder 294, a plurality of fast Fourier transform (FFT)/cyclic prefix removal modules 296-300, a plurality of symbol demapping modules 302-306, a multiplexer 308, a deinterleaver 310, a channel decoder 312, and a descramble module 314. The baseband processing module may further include a mode managing module 175. The space/time decoding module 294 receives P-inputs from the receiver paths and produces M-output paths. In an embodiment, the space/time decoding module 294 multiples the input symbols of each path with a decoding matrix that has the form of $$\begin{bmatrix} C_1 & C_2 & C_3 & \ldots & C_{2M-1} \\ -C_2^* & C_1^* & C_4 & \ldots & C_{2M} \end{bmatrix}$$

Note that the rows of the decoding matrix correspond to the number of input paths and the columns correspond to the number of output paths. Note that the number of M output paths of the space and time decoding may equal the number of P-input paths of the space and time decoding or the number of input paths P may equal M+1 paths.

The FFT/cyclic prefix removal modules 296-300 converts the M streams of symbols from time domain symbols to frequency domain symbols to produce M streams of frequency domain symbols. In one embodiment, the prefix removal function removals inter-symbol interference based on a prefix. Note that, in general, a 64-point FFT will be used for 20 MHz channels and 128-point FFT will be used for 40 MHz channels.

The symbol demapping modules 302-306 convert the frequency domain symbols into bit streams of data. In an embodiment, each symbol demapping module maps quadrature amplitude modulated QAM symbols (e.g., BPSK, QPSK, 16 QAM, 64 QAM, 256 QAM, et cetera) into a bit stream of data. Note that for IEEE 802.11(a) backward compatibility, double gray coding may be used. The multiplexer 308 combines the demapped symbol streams into a single path. The deinterleaver 310 deinterleaves the single path.

The iterative decoder 312, which will be described in greater detail with reference to FIGS. 8-10, decodes the deinterleaved data to produce decoded data. The descrambler 314 descrambles the decoded data to produce the inbound data 98. In one embodiment, the descrambler 314 removes (in GF2) a pseudo random sequence from the decoded data. A pseudo random sequence may be generated from a feedback shift register with the generator polynomial of $S(x)=x^7+x^4+1$ to produce scrambled data.

Figure 8:
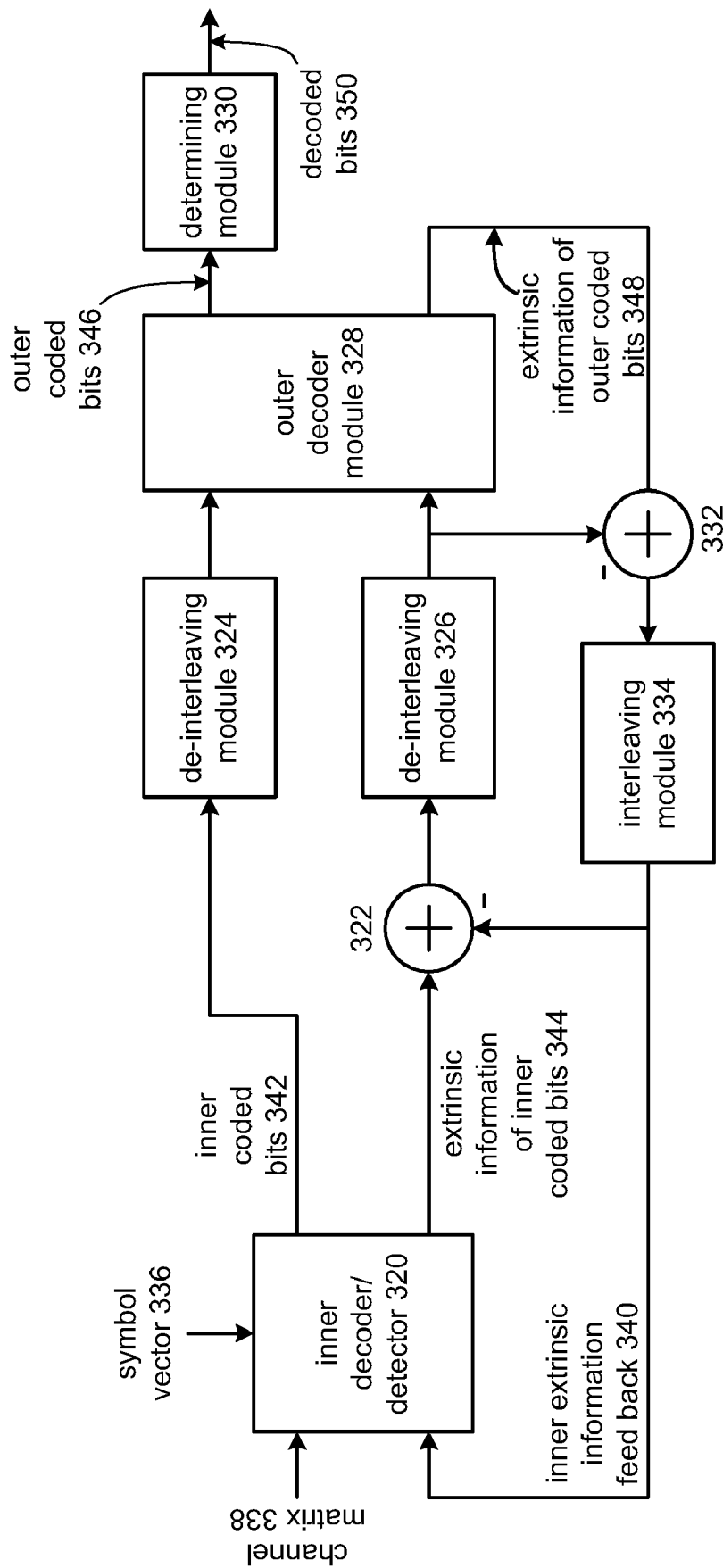
FIG. 8 is a schematic block diagram of an iterative decoder in accordance with the present invention.

FIG. 8 is a schematic block diagram of an iterative decoder that includes an inner decoder/detector 320, a subtraction module 322, a deinterleaving module 324, a deinterleaving module 326, an outer decoder module 328, a determining module 330, a subtraction module 332 and an interleaving module 334.

In operation, the inner decoder/detector 320 generates inner coded bits 342 and extrinsic information 344 of the inner code bits from a symbol vector 336 based on a channel matrix 338 and inner extrinsic information feedback 340. The symbol vector 336 corresponds to the stream of digital information received from the deinterleaver 310. The channel matrix 338 corresponds to an N×M channel transfer matrix where M represents the number of transmitters and N represents the number of receivers. The inner decoder/detector 320 may utilize A Posteriori Probability (APP) algorithm to generate the inner coded bits 342 and extrinsic information 344. In such an embodiment, the transmitted symbol vector may be represented by $a=(a_1, a_2, \ldots, a_M)$ and a bit sequence to which the symbol vector a is mapped may be represented by $x=(x_1, x_2, \ldots, x_L)$. Further, the received vector may be represented by $r=H*a+v$, where H corresponds to the channel matrix and v corresponds to a complex Gaussian noise vector with 0 mean and variance $\Sigma^2$. Given these parameters, the extrinsic information may correspond to a log-likelihood ratio value (L-value) for each transmitted bit, where the L value is expressed in equations 2.2-2.4 of the appendix. Through mathematical manipulation, equations 2.2 through 2.4 may be simplified using a max log rhythmic approximation to insert equation 2.18 of the appendix.

The determination of the extrinsic information may be further done utilizing a tree search algorithm for generating the APP soft values. Such a tree search algorithm may be developed based on a differential feedback equalization principal similar to a V-blast detection scheme. In this instance, the detector uses a combination of feed-forward filtering and feedback filtering based on the differential feedback equalization principle. In a V-blast detection, the receive vector is multiplied by a feed-forward matrix queue based on the equation 2.19 of the appendix where the asterisk denotes the Hermitian operator, and Z is a lower triangular matrix and V is the Gaussian noise vector.

For APP detection, with each bit value equal to 1 or 0, the functionality may be reduced to the function shown in equation 2.22. Utilizing a tree algorithm, which operates on incremental searches based on incremental branch metrics of a tree structure, the above equation may be represented by equation 2.23 of the appendix. By representing the detection process as a tree structure the total decision matrix at the $i^{th}$ node in which the branch metrics is given by equation 2.24 of the appendix.

The subtraction module 322 subtracts the inner extrinsic information feedback 340 from the extrinsic information 344 of the inner coded bits. The output of subtraction module 322 is deinterleaved via deinterleaving module 326 and provided as an input to the outer decoding module 328. Deinterleaving module 324 may deinterleave the inner coded bits 342 which are provided as another input to outer decoding module 328. Based on these inputs, the outer decoding module 328 generates outer coded bits 346 and extrinsic information of outer coded bits 348.

The determining module 330 generates decoded bits 350 based on the outer decoded bits 346. The subtraction module 332 subtracts the output of deinterleaving module 326 from the extrinsic information 348 of outer code bits. The output of the subtraction module 332 is interleaved via interleaving module 334 to produce the inner extrinsic information feedback 340. In one embodiment, the outer decoding module 328 utilizes a soft-input-soft-output module based on the maximum a posteriori (MAP) algorithm. Another embodiment of the outer decoder module 328 will be provided with reference to FIGS. 9 and 10.

Figure 9:
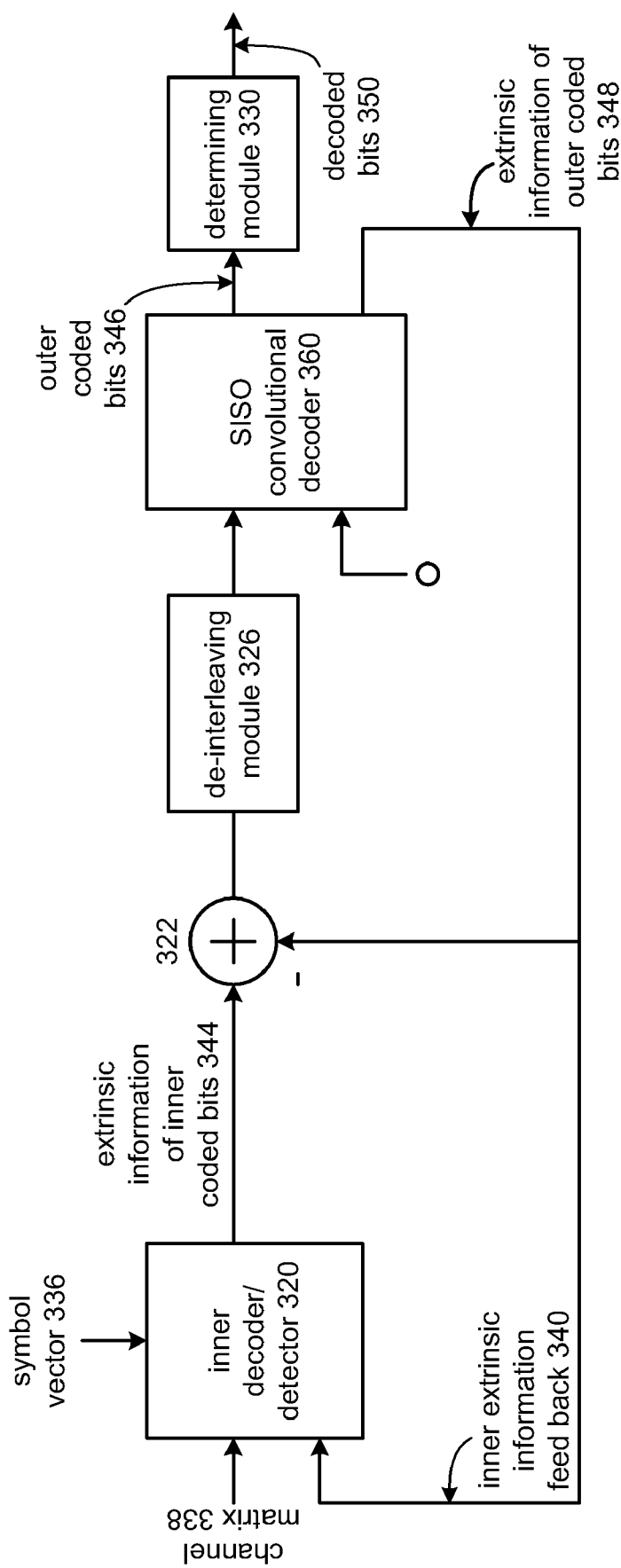
FIG. 9 is a schematic block diagram of another iterative decoder in accordance with the present invention.

FIG. 9 is a schematic block diagram of another embodiment of the iterative decoder 312 that includes the inner decoding/detector module 320, subtraction module 322, deinterleaving module 326, a soft-input-soft-output (SISO) convolutional decoder 360 and the determination module 330. The operation of the inner decoder 320, subtraction module 322 and deinterleaver module 326 are as previously described with reference to FIG. 8. The convolutional decoder 360 receives the extrinsic information via the deinterleaver module 326 and utilizing convolutional coding, produces the outer coded bits 330, 346 and the extrinsic information 348 of the outer code bits.

Figure 10:
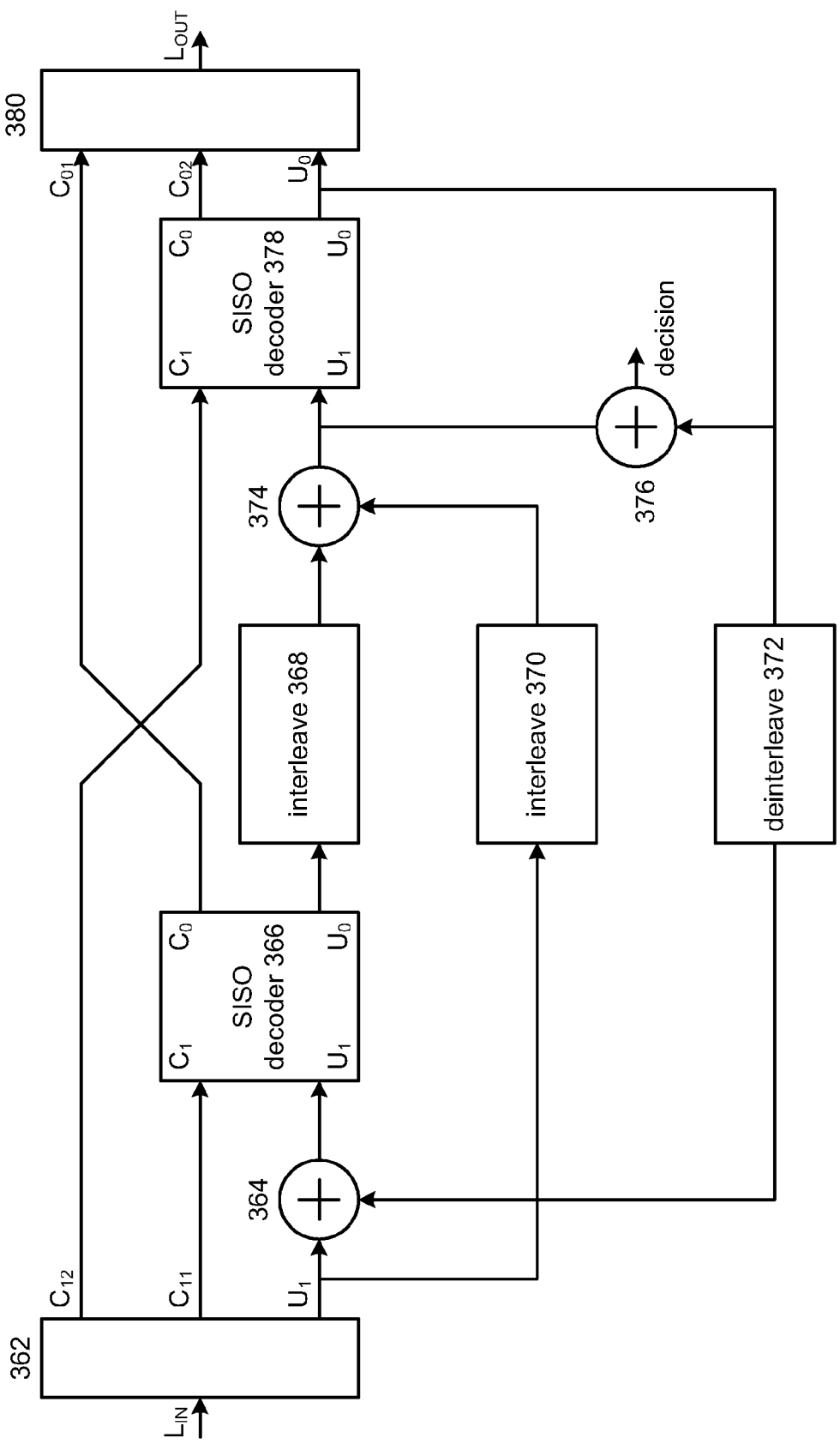
FIG. 10 is a schematic block diagram of an outer decoder module in accordance with the present invention.

FIG. 10 is a schematic block diagram of the outer decoder module 328 implemented as a turbo decoder. The outer decoder module 328 includes registers 362 and 380, a soft-input-soft-output (SISO) decoder 366, a summation module 364, an interleaving module 368, interleaving module 370, deinterleaving module 372, summation module 374, summation module 376 and SISO decoder 378. The SISO decoders 366 and 378 take a periori probabilities for the code bits as well as the information bits and generate the extrinsic information code bits for the information bits. This may be done utilizing known principles of the MAP algorithm.

In this embodiment, the letter C represents the extrinsic information and the letter U represents the information bits. By routing the extrinsic information and information bits as shown, a turbo decoder is produced.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented an iterative decoder for use with a wireless local area network receiver. As one of average skill in the art will appreciate, other embodiments may be derived from the teaching of the present invention without deviating from the scope of the claims.

What is claimed is:

1. A method for high data throughput reception in a wireless local area network (WLAN), the method comprises:

receiving a symbol vector representing M streams of symbols transmitted via a wireless communication channel;

producing a first output of inner coded bits and a second output of extrinsic information of the inner coded bits based on the symbol vector, a channel matrix, and inner extrinsic information feedback;

subtracting the inner extrinsic information feedback from the extrinsic information of the inner coded bits to produce current inner extrinsic information;

deinterleaving the current inner extrinsic information to produce deinterleaved inner extrinsic information;

deinterleaving the inner code bits to produce deinterleaved inner code bits;

determining outer coded bits and extrinsic information of the outer coded bits based on the deinterleaved extrinsic information, the deinterleaved inner coded bits, and a soft input soft output decoding process;

subtracting the deinterleaved inner extrinsic information from the extrinsic information of the outer coded bits to produce current outer extrinsic information;

interleaving the current outer extrinsic information to produce the inner extrinsic information feedback; and producing decoded bits based on the outer coded bits.

2. The method of claim 1, wherein the determining the extrinsic information of the inner coded bits comprises:
utilizing an A Posteriori Probability (APP) algorithm to generate a log-likelihood ratio value for each transmitted bit of the M streams of symbols.

3. The method of claim 2 further comprises:
using a tree search algorithm in accordance with the APP algorithm for generating the log-likelihood ratio value based on differential feedback equalization.

4. The method of claim 1, wherein the soft input soft output decoding processing comprises:
a convolutional code for determining the outer coded bits and the extrinsic information of the outer coded bits.

5. The method of claim 1, wherein the soft input soft output decoding processing comprises:
a turbo code for determining the outer coded bits and the extrinsic information of the outer coded bits.

6. A wireless local area network (WLAN) receiver having high data throughput, the WLAN receiver comprises:
a plurality of radio frequency (RF) receiving modules, wherein each of the plurality of the RF receiving modules is operably coupled to receive inbound RF signals and to convert the inbound RF signals into inbound digital symbols; and
a baseband processing module operably coupled to:
space and time decode the inbound digital symbols generated by the plurality RF receiver modules to produce M streams of symbols;
convert the M streams of symbols from time domain symbols to frequency domain symbols to produce M streams of frequency domain symbols;
demap the frequency domain symbols of the M streams of frequency domain symbols to produce streams of demapped data;
multiplex the streams of demapped data into a serial stream of demapped data;
decode the serial stream of demapped data to produce decoded data wherein the decoding includes:
determining inner coded bits and extrinsic information of the inner coded bits based on the serial stream of demapped symbols, a channel matrix, and inner extrinsic information feedback;
determining outer coded bits and extrinsic information of the outer coded bits based on the extrinsic information of the inner coded bits, the inner coded bits, and a soft input soft output decoding process;
generating the inner extrinsic information feedback based on the extrinsic information of the outer coded bits; and
producing decoded bits based on the outer coded bits; and
descramble the decoded data to produce inbound data.

7. The WLAN receiver of claim 6, wherein the determining the extrinsic information of the inner coded bits comprises:
utilizing an A Posteriori Probability (APP) algorithm to generate a log-likelihood ratio value for each transmitted bit of the at least one of the M streams of symbols.

8. The WLAN receiver of claim 7 further comprises:
using a tree search algorithm in accordance with the APP algorithm for generating the log-likelihood ratio value based on differential feedback equalization.

9. The WLAN receiver of claim 6, wherein the determining the outer coded bits and the extrinsic information of the outer coded bits comprises:
subtracting the inner extrinsic information feedback from the extrinsic information of the inner coded bits to produce current inner extrinsic information;
deinterleaving the current inner extrinsic information to produce deinterleaved inner extrinsic information; and
using the deinterleaved inner extrinsic information to represent the extrinsic information of the inner coded bits to determine the outer coded bits and the extrinsic information of the outer coded bits.

10. The WLAN receiver of claim 9, wherein the generating the inner extrinsic information feedback based on the extrinsic information of the outer coded bits comprises:
subtracting the deinterleaved current inner extrinsic information from the extrinsic information of the outer coded bits to produce current outer extrinsic information; and
interleaving the current outer extrinsic information to produce the inner extrinsic information feedback.

11. The WLAN receiver of claim 6, wherein the determining the outer coded bits and the extrinsic information of the outer coded bits comprises:
deinterleaving the inner coded bits to produce deinterleaved inner coded bits; and
using the deinterleaved inner coded bits to represent the inner coded bits to determine the outer coded bits and the extrinsic information of the outer coded bits.

12. The WLAN receiver of claim 6, wherein the soft input soft output decoding processing comprises:
a convolutional code for determining the outer coded bits and the extrinsic information of the outer coded bits.

13. The WLAN receiver of claim 6, wherein the soft input soft output decoding processing comprises:
a turbo code for determining the outer coded bits and the extrinsic information of the outer coded bits.

14. An iterative decoder for use in a wireless local area network (WLAN) receiver having high data throughput, the iterative decoder comprises:
an inner decoder/detector operably coupled to produce a first output of inner coded bits and a second output of extrinsic information of the inner coded bits from symbol vector based on a channel matrix and inner extrinsic information feedback;
a first subtraction module operably coupled to subtract the inner extrinsic information feedback from the extrinsic information of the inner coded bits to produce current inner extrinsic information;
a deinterleaving module operably coupled to deinterleave the current inner extrinsic information to produce deinterleaved inner extrinsic information;
a second deinterleaving module operably coupled to deinterleave the inner code bits to produce deinterleaved inner code bits;
an outer decoder operably coupled to determine outer coded bits and extrinsic information of the outer coded bits from the deinterleaved inner code bits and the deinterleaved inner extrinsic information in accordance with a soft input soft output decoding process;
a second subtraction module operably coupled to subtract the deinterleaved inner extrinsic information from the extrinsic information of the outer coded bits to produce current outer extrinsic information;
an interleaving module operably coupled to interleave the current outer extrinsic information to produce the inner extrinsic information feedback; and
a determining module operably coupled to produce decoded bits based on the outer coded bits.

15. The iterative decoder of claim 14, wherein the inner decoder/detector comprises:

an A Posteriori Probability (APP) algorithm to generate a log-likelihood ratio value for each transmitted bit of M streams of symbols that is represented by the symbol vector.

16. The iterative decoder of claim 15, wherein the inner decoder/detector comprises:
a tree search algorithm in accordance with the APP algorithm for generating the log-likelihood ratio value based on differential feedback equalization.

17. The iterative decoder of claim 14, wherein the outer decoder comprises:
a convolutional code for determining the outer coded bits and the extrinsic information of the outer coded bits.

18. The iterative decoder of claim 14, wherein the outer decoder comprises:
a turbo code for determining the outer coded bits and the extrinsic information of the outer coded bits.

19. A wireless local area network (WLAN) receiver having high data throughput, the WLAN receiver comprises:
a plurality of radio frequency (RF) receiving modules, wherein each of the plurality of the RF receiving modules is operably coupled to receive inbound RF signals and to convert the inbound RF signals into inbound digital symbols;
a space and time decoding module operably coupled to decode the inbound digital symbols generated by the plurality RF receiver modules to produce M streams of symbols;
Fast Fourier Transform (FFT) module operably coupled to convert the M streams of symbols from time domain symbols to frequency domain symbols to produce M streams of frequency domain symbols;
demapping module operably coupled to demap the frequency domain symbols of the M streams of frequency domain symbols to produce streams of demapped data;
multiplexer operably coupled to multiplex the streams of demapped data into a serial stream of demapped data;
iterative decoder operably coupled to decode the serial stream of demapped data to produce decoded data, wherein the iterative decoder includes:
an inner decoder/detector operably coupled to determine inner coded bits and extrinsic information of the inner coded bits from the serial stream of demapped data based on a channel matrix and inner extrinsic information feedback;
a first subtraction module operably coupled to subtract the inner extrinsic information feedback from the extrinsic information of the inner coded bits to produce current inner extrinsic information;
a deinterleaving module operably coupled to deinterleave the current inner extrinsic information to produce deinterleaved inner extrinsic information;
a second deinterleaving module operably coupled to deinterleave the inner code bits to produce deinterleaved inner code bits;
an outer decoder operably coupled to determine outer coded bits and extrinsic information of the outer coded bits from the deinterleaved inner code bits and the deinterleaved inner extrinsic information in accordance with a soft input soft output decoding process;
a second subtraction module operably coupled to subtract the deinterleaved inner extrinsic information from the extrinsic information of the outer coded bits to produce current outer extrinsic information;
an interleaving module operably coupled to interleave the current outer extrinsic information to produce the inner extrinsic information feedback; and
a determining module operably coupled to produce the decoded data based on the outer coded bits; and
descrambling module operably coupled to descramble the decoded data to produce inbound data.

20. The WLAN receiver of claim 19, wherein the inner decoder/detector comprises:
an A Posteriori Probability (APP) algorithm to generate a log-likelihood ratio value for each transmitted bit of the at least one of the M streams of symbols.

21. The WLAN receiver of claim 19, wherein the inner decoder/detector comprises:
a tree search algorithm in accordance with the APP algorithm for generating the log-likelihood ratio value based on differential feedback equalization.

22. The WLAN receiver of claim 19, wherein the outer decoder comprises:
a convolutional code for determining the outer coded bits and the extrinsic information of the outer coded bits.

23. The WLAN receiver of claim 19, wherein the outer decoder comprises:
a turbo code for determining the outer coded bits and the extrinsic information of the outer coded bits.

* * * * *

UNITED STATES PATENT AND TRADEMARK OFFICE
CERTIFICATE OF CORRECTION

PATENT NO.         : 7,466,773 B2
APPLICATION NO. : 10/876230
DATED              : December 16, 2008
INVENTOR(S)        : Hansen et al.

It is certified that error appears in the above-identified patent and that said Letters Patent is hereby corrected as shown below:

On the title page, second column

Please change the Examiner data from:

*Primary Examiner:* James M Perez

To this:

*Primary Examiner:* Shuwang Liu
*Assistant Examiner:* James M Perez

Signed and Sealed this

Twentieth Day of October, 2009

David J. Kappos
*Director of the United States Patent and Trademark Office*